United States Patent [19]

Takeuchi

[11] Patent Number: 5,147,814
[45] Date of Patent: Sep. 15, 1992

[54] METHOD OF MANUFACTURING AN LDDFET HAVING AN INVERTED-T SHAPED GATE ELECTRODE

[75] Inventor: Masahiro Takeuchi, Nagano, Japan

[73] Assignee: Seiko Epson Corporation, Tokyo, Japan

[21] Appl. No.: 733,643

[22] Filed: Jul. 22, 1991

Related U.S. Application Data

[62] Division of Ser. No. 500,200, Mar. 27, 1990, Pat. No. 5,097,300.

[30] Foreign Application Priority Data

Mar. 28, 1989 [JP] Japan .................. 1-76108
Mar. 28, 1989 [JP] Japan .................. 1-76109
Feb. 20, 1990 [JP] Japan .................. 2-38757

[51] Int. Cl.⁵ .................. H01L 21/28; H01L 21/336
[52] U.S. Cl. .................. 437/44; 437/192; 437/193
[58] Field of Search .................. 437/27, 40, 41, 44, 437/233, 200, 192, 193; 357/23.3

[56] References Cited

U.S. PATENT DOCUMENTS

| | | | |
|---|---|---|---|
| 4,577,391 | 3/1986 | Hsia et al. | 437/44 |
| 4,906,589 | 3/1990 | Chao | 437/233 |
| 4,963,504 | 10/1990 | Huang et al. | 437/233 |
| 4,971,922 | 11/1990 | Watabe et al. | 437/44 |
| 5,032,530 | 7/1991 | Lowrey et al. | 437/44 |

*Primary Examiner*—Mary Wilczewski
*Attorney, Agent, or Firm*—Spensley, Horn, Jubas & Lubitz

[57] ABSTRACT

A semiconductor device having an insulating film on a semiconductor substrate, first and second conductive gate electrode films and first and second source/drain regions having impurities and disposed opposite to each other. A length of the second gate electrode is smaller than that of the first one. The device further includes side wall insulating films formed bilaterally of the gate electrodes.

A method of manufacturing the semiconductor device, involving the steps of forming the insulating film on the substrate, first and second conductive films and an MOS transistor gate electrode, effecting thermal annealing thereon, and performing ion-implantation of first and second impurities into the substrate with the gate electrode serving as a mask. The method further involves the step of forming a side-wall insulating film by effecting anisotropic etching.

6 Claims, 2 Drawing Sheets

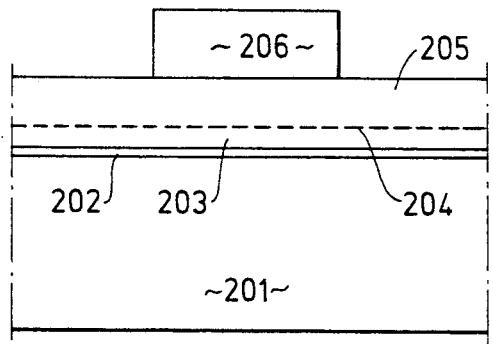
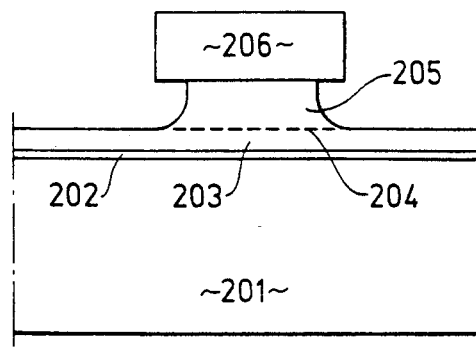
FIG. 2(a) PRIOR ART
FIG. 2(b) PRIOR ART
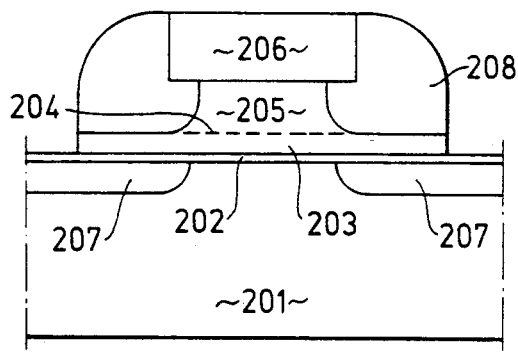
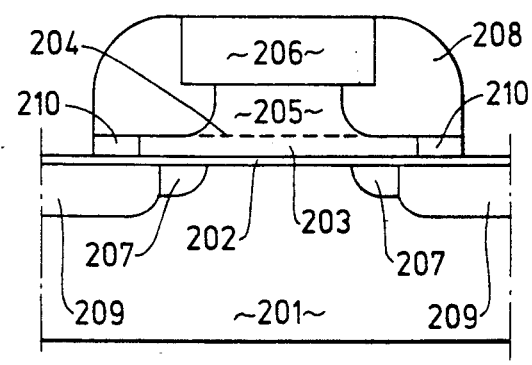
FIG. 2(c) PRIOR ART
FIG. 2(d) PRIOR ART
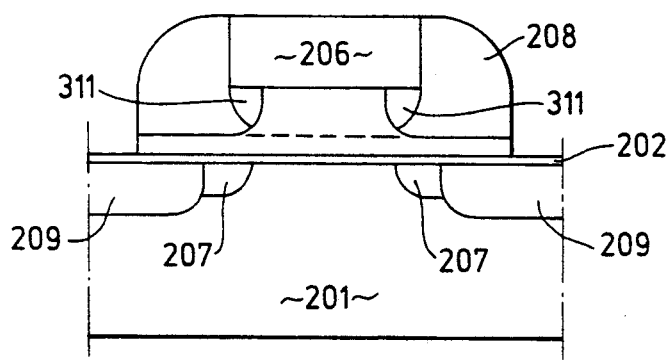
FIG. 3 PRIOR ART

5,147,814

METHOD OF MANUFACTURING AN LDDFET HAVING AN INVERTED-T SHAPED GATE ELECTRODE

This is a division of application Ser. No. 07/500,200, filed on Mar. 27, 1990, now U.S. Pat. No. 5,097,300.

BACKGROUND OF THE INVENTION

1. Field of the Invention

The present invention is directed to a semiconductor device and to a method of manufacturing an MOS or MIS-type semiconductor device.

2. Description of the Prior Art

As semiconductor devices have hitherto been constructed to have a hyperfine structure and a high degree of integration, the configuration of MOS transistors also has become hyperfine. The minuteness of element dimensions, however, causes the problem that properties associated with hot carriers tend to be deteriorated. In order to obviate this problem, there was proposed an LDD (Lightly Doped Drain) structure. An improvement of the LDD structure is described on pages 38–41 of "The Impact of Gate-Drain Overlapped LDD (Gold) for Deep Submicron VLSI's", *IEDM Tech. Dig.*, written by R. Izawa, T. Kure and E. Takeda, published in 1987.

A manufacturing method reported in this document will hereinafter be described with reference to FIGS. 2 which show the following components: a p-type semiconductor substrate 201; a gate oxide film 202; a polysilicon film 203; a natural oxide film 204; a polysilicon film 205; a silicon oxide film 206; an n-type impurity layer 207 having a low concentration; a side wall 208 of an oxide film; an n-type impurity layer 209 having a high concentration; and an oxide film 210.

To start with, the p-type semiconductor substrate 201 undergoes thermal oxidation of form the gate oxide film 202. Next, the polysilicon film 203 is deposited to a small thickness by the CVD method which is thereafter left exposed to the air, thus forming the natural oxide film 204 having a thickness of 5 to 10Å. Subsequently, the polysilicon film 205 and the silicon oxide film 206 are sequentially deposited by the CVD method. As illustrated in FIG. 2(a), unnecessary portions of the silicon oxide film 206 are eliminated by photoetching. Dry etching is, as depicted in FIG. 2(b), effected, with the oxide film 206 serving as a mask, to remove unnecessary portions of the polysilicon film 205. The n-type impurity layer 207 is formed by performing ion implantation of an n-type impurity, i.e., phosphorus, using silicon oxide film 206 and polysilicon film 205 as a mask. In the wake of this process, as illustrated in FIG. 2(c), the side wall insulating film 208, conceived as a silicon oxide film, is formed by dry etching after depositing a silicon oxide film by the CVD method. Oxidation is, as depicted in FIG. 2(d), carried out at 800° in a wet atmosphere, thus forming the oxide film 210. Subsequently, the n-type impurity layer 209 is formed by effecting ion implantation of an n-type impurity, viz., arsenic, wherein the gate electrode 203, oxide film 206 and side wall insulating film 208 serve as a mask.

There arise, however, the following problems inherent in the above-mentioned prior art process. Although properties of the MOS transistor largely vary depending on the lateral length of the oxide film 210, it is difficult to control the dimensions of that film because the lateral length is determined by the thickness of the polycrystalline silicon film 203 and by oxidizing conditions in the wet atmosphere. Especially when the gate length of the MOS transistor is as minute as the submicron region, there are caused substantial fluctuations in the transistor properties due to variations in the lateral length of the oxide film 210.

Based on the prior art process, when depositing the silicon oxide film 208 by the CVD method, the oxide film 206 on the gate electrodes 203 and 205 overhangs, and hence, as illustrated in FIG. 3, it is hard for oxide film 208 to form under film 206, resulting in formation of voids 311. This leads to a deterioration of the moisture resistance property of the MOS transistor.

The prior art described above presents additional problems. When forming the MOS transistor, the thicknesses of the films disposed on a channel—i.e., the gate oxide film 202, polysilicon film 203, natural oxide film 204, polysilicon film 205 and silicon oxide film 206—combine to provide a large step. Consequently, a metallization layer is further formed on the gate electrode so as to traverse this layer. In this state, the metallization layer on the gate electrode is in some cases disconnected due to the above-mentioned step, or, alternatively, the metallization layer is short-circuited because of the portions which remain unetched when forming the metallization layer on the gate electrode.

SUMMARY OF THE INVENTION

It is a primary object of the present invention, which has been devised to obviate the foregoing problems, to provide a semiconductor device which causes no short-circuit and disconnection of a metallization layer formed on a gate electrode, exhibits a smaller range of variation in transistor properties, and has a good moisture resistance property.

To this end, according to one aspect of the present invention, there is provided a semiconductor device comprising:

a substrate composed of a semiconductor material of a first conductivity type, the substrate having an outer surface;

a first insulating film disposed on the outer surface of the substrate;

a gate electrode having two opposed sides and composed of a first conductive film formed on the first insulating film and a second conductive film formed on the first conductive film, each of the conductive films having two opposed edges defining respective portions of the opposed sides of the gate electrode;

a first source region and a first drain region, each the region being disposed at a respective side of the gate electrode and being formed in the substrate by impurities of a second conductivity type;

wherein the distance between the opposed edges of the second conductive film is less than the distance between the opposed edges of the first conductive film, the opposed edges of the second conductive film are parallel to, and spaced inwardly of, the opposed edges of the first conductive film, the first source and drain regions are spaced from one another in the direction between the two opposed edges of one of the conductive films, and each of the first source and drain regions has a lateral boundary which is located at least approximately opposite a respective opposed edge of one of the conductive films.

Based on such configurations, the depth, below the substrate surface, of the first source/drain regions formed on the semiconductor substrate on both sides of the second gate electrode is greater than the depth of the second source/drain regions formed on the semiconductor substrate on both sides of the first gate electrode. In other words, starting from the substrate surface, the first source/drain regions are at a greater depth than are the second source/drain regions.

The first conductive film of the gate electrode is a polysilicon film, while the second conductive film is a refractory metal film or a refractory metal silicide film.

According to a further aspect of the invention, there is provided a method of manufacturing a semiconductor device, comprising the steps of: forming a first insulating film on a first conductivity type semiconductor substrate; sequentially forming a first conductive film on the first insulating film and a second conductive film on the first conductive film to establish an MOS transistor gate electrode composed of the firs&. and second conductive films; effecting thermal annealing thereon; performing ion-implantation of first impurities of a second conductivity type into the semiconductor substrate with the gate electrode serving as a mask; and performing the ion-implantation of second impurities of the second conductivity type into the semiconductor substrate with the gate electrode serving as a mask.

According to a still further aspect of the invention, there is provided a method of manufacturing a semiconductor device, comprising the steps of: forming a first insulating film on a first conductivity type semiconductor substrate; forming a first conductive film on the first insulating film; sequentially forming a second conductive film on the first conductive film; forming an MOS transistor gate electrode by use of the first and second conductive films; effecting thermal forming an MOS transistor gate electrode by use of the first and second conductive films; effecting thermal annealing thereon; performing ion-implantation of first impurities of a second conductivity type into the semiconductor substrate with the gate electrode serving as a mask; forming a side wall insulating film on the gate electrode by use of a second insulating film by effecting anisotropic ion etching after forming the second insulating film on the gate electrode as well as on the semiconductor substrate; and introducing second impurities of the second conductivity type with the gate electrode and the side wall insulating film serving as a mask.

In this method, when performing the ion-implantation of the first impurities of the second conductivity type, the species of implanted ions and the ion-implantation accelerating energy are so set that the ions cannot be implanted throughout the combined thickness of the first and second conductive films but the ions are transmissible through the thickness of the first conductive film.

In the methods described above, the depth of the region of the second ion-implanted impurities of the second conductivity type is smaller than that of the region of the first impurities of the second conductivity type.

In the methods given above, the first conductive film of the gate electrode is a polysilicon film, while the second conductive film is a refractory metal film or a refractory metal silicide film.

BRIEF DESCRIPTION OF THE DRAWINGS

Other objects and advantages of the invention will become apparent during the following discussion taken in conjunction with the accompanying drawings, in which:

FIGS. 2(a) through 2(d) and 3 are sectional views in combination illustrating a prior art semiconductor device.

DESCRIPTION OF THE PREFERRED EMBODIMENT

Figure 1A:
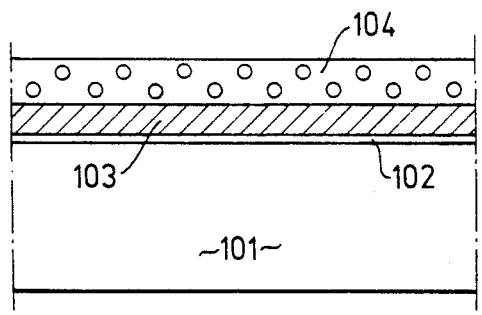
FIGS. 1(a) through 1(f) are sectional views in combination showing a sequence of the steps of a method of manufacturing a semiconductor device in one embodiment of the present invention.

An embodiment of the present invention will hereinafter be described with reference to FIGS. 1(a) through 1(f). To start with, as depicted in FIG. 1(a), a first conductivity type semiconductor, or p-type silicon, substrate 101 doped with boron is oxidized at 1000° C. in an oxidizing atmosphere, thereby forming a gate oxide film 102 having a thickness of 150Å. Subsequently, a polysilicon film 103 is deposited to a thickness of 1000Å to 3000Å by the CVD method, and is doped with phosphorus at a concentration of more than $10^{19}$ atoms $cm^{-3}$ thermal diffusion. Hereinafter, the term "atoms" $cm^{-3}$ will be omitted from the identification of concentration and dose levels. Thereafter, a refractory metal film or molybdenum film 104 is formed to have a thickness of 1500Å to 4000Å by sputtering.

Figure 1B:
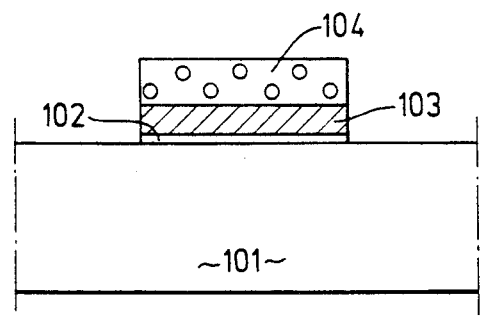

Unnecessary portions of gate oxide film 102, polysilicon film 103 and molybdenum film 104 are, as illustrated in FIG. 1(b), eliminated by photoetching, thus forming a gate electrode for an MOS transistor. Then, thermal annealing is effected thereon at 850° C. to 1100° C., with the result that the molybdenum film 104 reacts with the polysilicon film 103 disposed thereunder to thereby create a molybdenum silicide film 105. At this time, the volume of the molybdenum silicide film 105 is reduced to be less than that of the above-mentioned molybdenum film 104. Conversion of exemplary metals to the corresponding silicide results in the following volume reduction percentages: molybdenum silicide ($MoSi_2$) is typically 27%; tungsten silicide ($WSi_2$) is 27%; tantalum silicide ($TaSi_2$) is 25%; and titanium silicide ($TiSi_2$) is 23%.

Figure 1C:
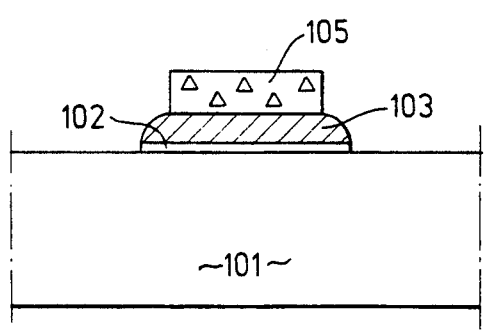

In the gate electrode which is, as in this embodiment, composed of molybdenum polycide, only the molybdenum silicide film 105 of the gate electrode, as shown in FIG. 1(c), contracts in the lateral directions, i.e., in directions parallel to the surface of substrate 101. As defined in this embodiment, the amount of linear contraction ranges from 0.05 μm to 0.2 μm as a total on both sides of the gate electrode on the assumption that the gate length after etching the MOS transistor is 0.8 μm. The gate length is in the direction between the source and drain regions to be subsequently formed, on the direction of current flow in the completed device. Hence, the length dimension of molybdenum silicide film 105 disposed on polysilicon film 103 after effecting thermal annealing is 0.6 μm through 0.75 μm. The amount of contraction can be controlled with a high accuracy and facility simply by controlling the thicknesses of polycrystalline silicon film 103 and of molybdenum film 104 and also the thermal annealing temperature after forming the gate electrode.

Figure 1D:
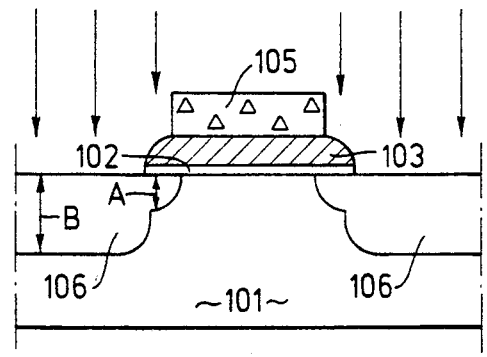

Next, as illustrated in FIG. 1(d), there is carried out the ion-implantation of n-type impurities—i.e., phosphorus is used herein—under conditions of an accelerating voltage of 80 KeV to 200 KeV, and a dose of $5 \times 10^{12} cm^{-2}$ to $5 \times 10^{14} cm^{-2}$. As a result, the phosphorus is not implanted into the silicon substrate directly beneath the gate electrode composed of both polysilicon film 103 and molybdenum silicon film 105, whereas the phosphorous is implanted to a shallow depth into the silicon substrate regions under the portions of the polycrystalline silicon film 103 from which the molybdenum silicide film has contracted. Besides, the phosphorus is implanted more deeply into the silicon substrate in source/drain regions where no gate electrode exists, thereby forming an n-type impurity layer 106 having a low impurity concentration. FIG. 1(d) illustrates the spatial profile of the impurities at that time in the present embodiment.

According to a preferred embodiment, gate oxide film 102 is formed to have a thickness of 150Å; polysilicon film 103 is 2000Å in thickness; and molybdenum film 104 is 2500Å thick. Anisotropic etching is effected so that the length of the gate electrode of the MOS transistor, shown in FIG. 1(b), comes to 0.8 μm; and thermal annealing is performed at 1000° C., thereby forming the molybdenum silicide film 105 of FIG. 1(c). At this time, molybdenum silicide film bilaterally contracts by 0.1 μm on both sides, and the length thereof becomes approximately 0.6 μm. Then, the ion-implantation of phosphorus is effected, wherein the accelerating voltage is set to 160 KeV, and the dose is set such as $3 \times 10^{13} cm^{-2}$.

In consequence of this process, the phosphorus is not implanted into a channel region of the silicon substrate provided directly beneath the gate electrode consisting of the polycrystalline film 103 and of the molybdenum silicide film 105, whereas into the silicon substrate under the gate electrode portion constituted only by polycrystalline silicon film 103, from which molybdenum silicide film 105 has contracted, the phosphorus is implanted shallowly.

The junction depth A is approximately 0.2 μm; the depth of the peak of impurity concentration distribution of phosphorus is about 0.05 μm; and the concentration at the peak is nearly $1 \times 10^{18} cm^{-3}$.

In the source/drain regions wherein no gate electrode is provided, the phosphorus is implanted deeply into the silicon substrate. The junction depth B is approximately 0.4 μm; the depth of the peak of impurity concentration distribution of phosphorus is about 0.25 μm; and the concentration at the peak is nearly $1 \times 10^{18} cm^{-3}$. It is additionally stated that the data on the profile of the impurities is obtained after effecting an annealing process at 950° C. for 20 minutes. As discussed above, a useful transistor is obtained by the steps described above with reference to FIGS. 1(a) to 1(d).

Figure 1E:
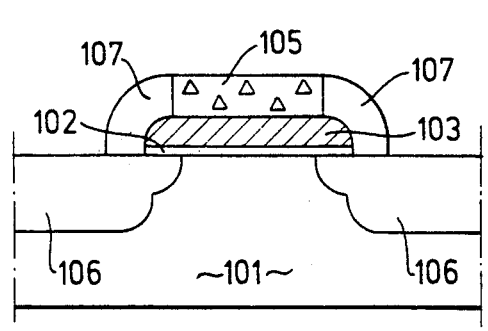
Figure 1F:
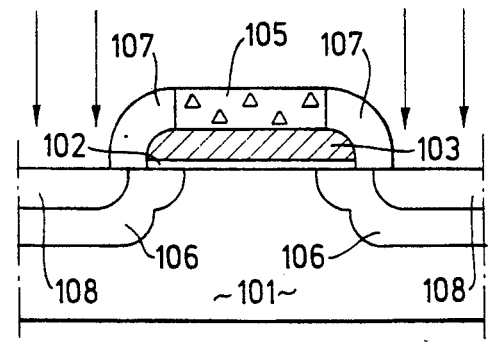

However, the following steps serve to decrease sheet resistances of the source/drain regions. A silicon oxide film is deposited to a thickness of 4000Å to 8000Å on the gate electrode as well as on silicon substrate 101 by the CVD method, and thereafter reactive ion etching is carried out to leave side wall oxide film 107 as shown in FIG. 1(e). In the wake of this process, as shown in FIG. 1(f), ion-implantation of n-type impurities, e.g., arsenic in this embodiment, is performed at an accelerating voltage of 50 KeV to 150 KeV, and a dose of $1 \times 10^{15} cm^{-2}$ to $1 \times 10^{16} cm^{-2}$; and subsequently thermal annealing is effected at 900° C. to 1000° C., thereby forming the n-type impurity layer 108 having a high impurity concentration. Note that the n-type impurity layer 108 may be formed likewise without shaping the side wall oxide film 107.

The arrangement of the MOS transistor constructed in accordance with the above-described steps is that the polycrystalline silicon gate electrode film 103 overlaps the n-type impurity layer 106 having a low concentration, and hence when a voltage is impressed on the gate, the apparent resistance of the low concentration n-type impurity layer 106 is reduced due to its electric field. On the other hand, a crosswise electric field within the low concentration n-type impurity layer 106 is relieved. This results in an increment in drain current of the transistor, and it is therefore possible to avoid a deterioration of conductance which is associated with hot carriers.

In embodiments of the present invention, the properties of the MOS transistor largely vary depending on the overlapping length of the polysilicon gate electrode film 103 on the low concentration n-type impurity layer 106, but the extent of the overlap can be controlled with a high accuracy and facility simply by changing the thicknesses of the polysilicon film 103 and of the molybdenum film 104 and also the thermal annealing temperature after forming the gate electrode. Hence, variations in the properties of the MOS transistor are reduced.

In this embodiment, there exists no part at which overhanging takes place, as in the case of electrode layer 206 in FIGS. 2 and 3. Consequently, voids are not formed, and there is no possibility for the transistor to have a diminished moisture resistance property.

Moreover, according to the embodiment of the present invention, the film thickness on the channel implies a sum of thicknesses of the gate oxide film 102, the polycrystalline silicon film 103 and the molybdenum silicide film 105. Hence, where a metallization layer is further formed on the gate electrode, there is no possibility of causing a short-circuit of the metal due to portions which remain unetched when forming the metallization layer on the gate electrode, because the step-difference is small, even when the metallization layer traverses the gate electrode.

In this embodiment, the refractory metal film disposed on the polysilicon film is composed of molybdenum. The same effects can, however, be expected even by employing tungsten, titanium, platinum, cobalt, nickel, or tantalum; and refractory metal silicide films of those metals may also be used.

The first embodiment described above represents a case where the phosphorus is employed as an n-type impurity of the low concentration n-type impurity layer. The impurity may, however, include arsenic or antimony, or combinations of these impurities, e.g., phosphorus and arsenic, may be used. The second embodiment discussed above has also dealt with a case where the arsenic is employed as an n-type impurity of the high concentration n-type impurity layer. However, phosphorus or antimony are likewise available, and combinations of those impurities may be used. Furthermore, in these embodiments, boron is adopted as an impurity of the p-type semiconductor substrate, but gallium, aluminum or indium may also be available.

The description has been focused on n-channel MOS transistors. The like effects are, as a matter of course, exhibited in a case where the present invention is applied to a p-channel MOS transistor.

According to the present invention, the drain current of the MOS transistor is increased, and it is feasible to avoid the deterioration of conductance which is due to hot carriers. Thus, a high-speed and highly reliable MOS transistor can be provided.

In accordance with the present invention, it is possible to control, with a high accuracy but closer tolerances, the length of overlapping of the gate electrode with the source/drain regions associated with the low concentration impurity layer, on which the properties of the MOS transistor depend. It is therefore possible to place closer tolerances on the conductance and drain current of the MOS transistor.

In accordance with the present invention, the moisture resistance property of the MOS transistor is not diminished.

The present invention exhibits the additional advantage of minimizing the possibilities of causing short circuits and disconnections of the metallization layer on the gate electrode.

As can be clarified from the above, the present invention provides a high-speed semiconductor device having a high quality, high reliability and high yield.

This application relates to subject matter disclosed in Japanese Patent Applications Nos. 76108/89, filed Mar. 28, 1989, 76109/89, filed Mar. 28, 1989, and 38757/90, filed Feb. 20, 1990, the disclosure of which is incorporated herein by reference.

Although the embodiments of the present invention have been described in detail with reference to the accompanying drawings, it is to be understood that present invention is not limited to those precise embodiments. A variety of modifications and changes may be effected therein by one skilled in the art without departing from the scope or spirit of the invention.

What is claimed is:

1. A method of manufacturing a semiconductor device, comprising the steps of:
   providing a substrate composed of a semiconductor material of a first conductivity type, the substrate having an outer surface;
   forming a first insulating film on the outer surface of the substrate;
   forming a first conductive film on the first insulating film and forming a second conductive film on the first conductive film, each conductive film having two opposed edges;
   forming the first and second conductive film into an MOS transistor gate electrode having a defined shape including two opposed sides, respective portions of which sides are defined by the two opposed edges of the conductive films;
   effecting thermal annealing of the gate electrode for causing the opposed edges of the second conductive film to be spaced inwardly of the opposed edges of the first conductive film; and
   performing ion implantation of impurity ions of a second conductivity type, opposite to the first conductivity type, into the substrate, via the outer surface, with the gate electrode acting as a mask with respect to the impurity ions, said step of performing ion implantation being carried out with a type of impurity and with an ion accelerating voltage selected such that the impurity ions cannot traverse a path through both the first conductive film and the second conductive film but can traverse a path through only the first conductive film.

2. A method as defined in claim 1 wherein the first conductive film is composed of polysilicon and the second conductive film is composed of at least one of a refractory metal and a refractory metal silicide.

3. A method as defined in claim 1 comprising the further steps of:
   forming a side wall insulating film on each opposed side of the gate electrode; and
   introducing impurity ions of the second conductivity into the substrate, via the outer surface, with the gate electrode and the side wall insulating films acting as a mask with respect to the impurity ions.

4. A method as defined in claim 3 wherein said step of performing ion implantation causes impurity ions to be introduced into the substrate to a first depth below the outer surface, and said step of introducing impurity ions causes impurity ions to be introduced into the substrate to a second depth below the outer surface, the second depth being shallower than the first depth.

5. A method as defined in claim 4 wherein the first conductive film is composed of polysilicon and the second conductive film is composed of at least one of a refractory metal and a refractory metal silicide.

6. A method as defined in claim 1 wherein the first conductive film is composed of polysilicon and the second conductive film is composed of at least one of a refractory metal and a refractory metal silicide.

* * * * *